United States Patent [19]

Guggenbühl et al.

[11] 4,337,438

[45] Jun. 29, 1982

[54] PULSE-WIDTH MODULATOR CIRCUIT

[75] Inventors: Walter Guggenbühl, Stäfa; Mathis Halder, Baar, both of Switzerland

[73] Assignee: LGZ Landis & Gyr Zug AG, Zug, Switzerland

[21] Appl. No.: 121,268

[22] Filed: Feb. 13, 1980

[30] Foreign Application Priority Data

Mar. 1, 1979 [CH] Switzerland ............... 2028/79

[51] Int. Cl.³ .................................... H03F 3/38
[52] U.S. Cl. .................................... 330/10
[58] Field of Search ............... 330/10, 207 A, 251

[56] References Cited

U.S. PATENT DOCUMENTS 3,781,634 12/1973 Jessee .................... 330/10 X
4,021,745 5/1977 Suzuki et al. ............ 330/10

OTHER PUBLICATIONS

Chudobiak et al., "Frequency and Power Limitations of Class-D Transistor Amplifiers", IEEE Journal of Solid-State Circuits, vol. SC-4, No. 1, Feb. 1969, pp. 25, 34, 35.

Primary Examiner—James B. Mullins
Attorney, Agent, or Firm—Ernest F. Marmorek

[57] ABSTRACT

A pulse-width modulator circuit includes a pulse-width modulator which has an input for a low-frequency modulation signal and an input for a carrier signal, a carrier signal generator which has an output connected to the carrier signal input of the pulse-width modulator for providing a carrier frequency, a buffer stage postcoupled to the pulse-width modulator, an output filter postcoupled to the pulse-width modulator, including a relatively narrow-band resonant circuit for damping the carrier frequency, and a regulating device forming a feedback path between the resonant circuit and the carrier signal generator for maintaining the carrier frequency substantially at the resonance frequency of the resonant circuit.

7 Claims, 3 Drawing Figures

PULSE-WIDTH MODULATOR CIRCUIT

BACKGROUND OF THE INVENTION

A pulse-width modulated signal amplifier is known from U.S. Pat. No. 4,021,745. In this patent, a low-pass filter is used to filter out amplified low frequency signals. But a low-pass filter cannot suppress very well the carrier frequency dominating the frequency spectrum, for which reason a clean-cut separation of the information carrying signal from any perturbing signals, and therefore also a high signal quality, is not attainable.

There is further known from the IEEE Journal of Solid State Circuits, February, 1969, pages 34-35, a circuit for an induction heater in which the phase angle of an inductive load is detected, and the frequency of a signal source controlling a switching amplifier is regulated. This circuit is not, however, utilized for a pulse-width modulated signal amplifier; furthermore, regulation of the frequency of the signal source is not accomplished in order to suppress an interferring signal, but to adopt the circuit to any load changes.

SUMMARY OF THE INVENTION

One of the principal objects of the invention is an optimal damping of the carrier frequency of the carrier signal. As the regulating device continuously tunes the carrier frequency to the resonant frequency of the resonant circuit suppressing the carrier frequency of the carrier signal, any shift of the resonant frequency due to aging, temperature influence, geometrical changes of any circuit elements or the like, cannot impair the damping of the carrier signal, and consequently the signal quality of the circuit.

Further objects and advantages of the invention will be set forth in the following Specification, and in part will be obvious therefrom, without being specifically referred to, the same being realized and attained as pointed out in the claims hereof.

BRIEF DESCRIPTION OF THE DRAWING

For a fuller understanding of the nature and objects of the invention, reference should be had to the following detailed description, taken in connection with the accompanying drawings, in which.

DESCRIPTION OF THE PREFERRED EMBODIMENTS

Figure 1:
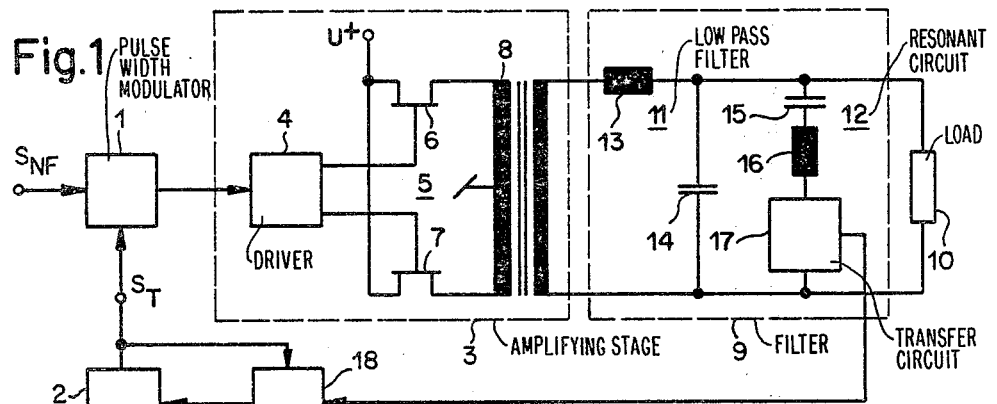
FIG. 1 is a block-schematic circuit diagram of the pulse-width modulator circuit, according to the present invention.

In carrying the invention into effect, a pulsewidth modulator 1 is provided with an input for a low-frequency signal $S_{NF}$ to be amplified, and another input for a carrier signal $S_T$ having a frequency $f_t$. A carrier-signal generator 2 connected to the pulse-width modulator 1 supplies the carrier frequency signal $S_t$. This carrier-signal generator 2 has a control input 2A to which a signal can be applied to vary the carrier frequency $f_T$. A voltage-controlled oscillator (VCO) is, for example, suitable as the carrier signal generator 2.

The pulse-width modulator 1 generates rectangular pulses, which recur at the frequency $f_T$, and the width or duration of which is modulated by the low-frequency signal $S_{NF}$. Such pulse-width modulators are known, and will therefore not be described herein in further detail. It is worth mentioning, however, that the pulse-width modulator 1 may consist, for example, of an impulse former and a comparator, where the impulse former converts, for example, the rectangular carrier signal $S_T$ into a triangular having a frequency signal $f_T$, and wherein the comparator compares the low-frequency signal $S_{NF}$ with the triangular signal, and supplies the desired pulse-width modulated output signal.

This output signal of the pulse-width modulator 1 controls an amplifier, or amplifying stage 3, which consists in the examples shown of a driver 4, and an output stage 5. The output stage 5 is formed by two electronic switches 6 and 7, and a transformer 8. Depending on the logic state of the output signal of the pulse-width modulator 1, a voltage source U+ is switched via the switches 6 and 7 to one or the other end tap of the primary winding of the transformer 8, whose center tap is grounded.

The secondary winding of the transformer 8 is connected via a filter 9 to a load 10. The filter 9 contains a low-pass filter 11 and a resonant circuit 12 of relatively small band-width for damping of the carrier frequency $f_T$. The low-pass filter 11 consists, in the examples shown, of a coil 13 and a capacitor 14, and the resonant circuit 12 consists of a capacitor 15 and a coil 16. The capacitor 15 and the coil 16 are series-connected and form an absorptive filter, which is connected in parallel with the capacitor 14 and the load 10.

The output of a transfer circuit 17, which generates a signal proportional to the current in the resonant circuit 12, and the output of the carrier signal generator 2 are fed to a phase comparator 18, whose output is connected to the control input 2A of the carrier signal generator 2. The phase comparator 18 forms a regulating circuit coupled to the resonant circuit 12 and to the carrier signal generator 2, which maintains the carrier frequency $f_T$ at the resonant frequency of the resonant circuit 12.

The operation of the pulse-width modulator circuit is as follows:

As has already been mentioned, the pulse-width modulator 1 generates rectangular impulses. These are amplified in the amplifying stage 3. At the input of the filter 9 there is generated a signal, which is composed of the amplified low-frequency signal, and an interfering signal. The base frequency of the carrier signal $S_T$, namely the carrier frequency $f_T$, dominates the interfering spectrum. The low-pass filter 11 suppresses the higher frequency components of the interfering spectrum relatively well, but cannot adequately suppress the carrier frequency $f_T$. The carrier frequency $f_T$ is therefore further damped in the resonant circuit 12, so that a high signal-purity of the filtered and amplified low-frequency signal is obtained. The resonant circuit 12 has a high quality factor, so that it can suppress the carrier frequency $f_T$ completely, and is therefore of small bandwidth.

The phase of the output signal from the transfer circuit 17 is compared with a phase of the carrier signal $S_T$ in the phase comparator 18. If the phase angle between these two signals differs by a predetermined amount, then the phase comparator 18 generates a control signal, which shifts the phase of the carrier signal $S_T$ in a correcting direction. Thus, the carrier frequency $f_T$ becomes completely tuned to the resonant frequency of the resonant circuit 12, and an optimal damping of the carrier frequency of the carrier signal $S_T$ is ensured. One can therefore dispense with keeping the resonant frequency of the damping circuit 12 constant, which, in any case, would be rather difficult to attain.

The transfer circuit 17 can be implemented, for example, by an inductive transducer connected in series with the resonant circuit 12. But it is also possible to use only an inductor as a transfer circuit, which inductor is inductively coupled to the coil 16.

Figure 2:
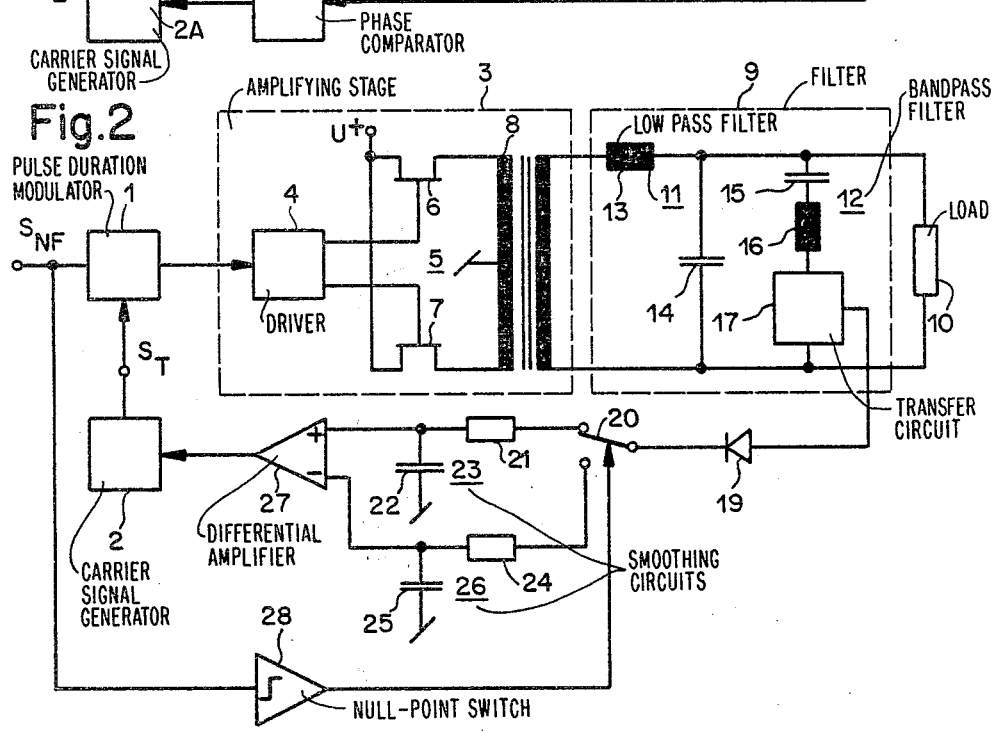
FIG. 2 is a variation of the circuit of FIG. 1.

In FIG. 2, the reference numerals 1 through 17 denote parts similar to those shown in FIG. 1. The output of the transfer circuit 17 is connected via a rectifier 19 to a switch 20, which switches the rectifier 19 in one position to a smoothing circuit 23 (consisting of a resistor 21 and a capacitor 22) and in another position to a smoothing circuit 26 (consisting of a resistor 24 and a capacitor 25). The smoothing circuits 23 and 26 are coupled, respectively, to inputs of a differential amplifier 27, whose output is connected to the control input of the carrier signal generator 2. A null-point threshold switch 28 controls the switch 20, so that the rectifier 19 is connected during one half-wave of the low frequency signal $S_{NF}$ to the smoothing circuit 23, and during the other half-wave to the smoothing circuit 26.

The resonant circuit 12 forms a demodulator for the frequency-modulated signal appearing at the input of the filter 9. At the output of the transfer circuit 17, there is generated an amplitude-modulated signal, whose envelope has a frequency double that of a low-frequency signal $S_{NF}$. If the carrier frequency $f_T$ is completely tuned to the resonant frequency of the resonant circuit 12, then subsequent half-waves of this envelope have equal amplitudes, but otherwise have unequal amplitudes. Consequently, there appear across the smoothing circuits 23 and 26 either equal or different voltages, which are compared in the differential amplifier 27. If the voltages are unequal, then the differential amplifier 27, which forms the output of a regulating device operating as an envelope detector, provides a control signal to the carrier signal generator 2, so that its frequency is correspondingly shifted.

Figure 3:
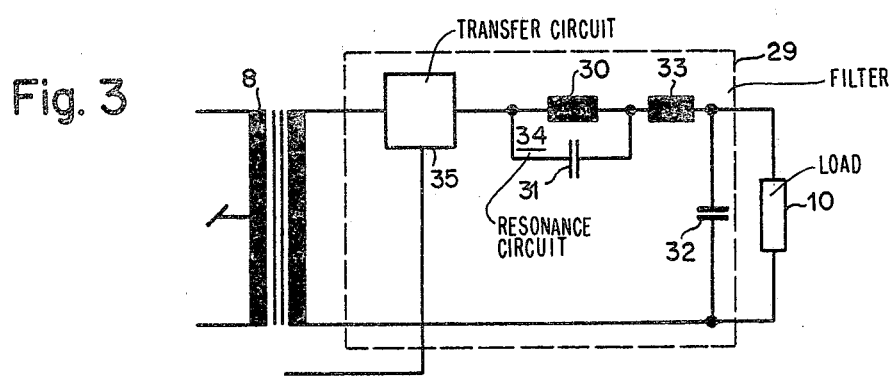
FIG. 3 is a further variation of the circuit of FIG. 1.

The filter 29 shown in FIG. 3 includes a series-connected coil 30, a capacitor 31 shunted across the coil 30, a coil 33 in series with the shunt combination of the coil 30 and the capacitor 31, and a capacitor 32 shunted across the load 10. The coil 30 and the capacitor 31 form a rejector circuit 34 for damping of the carrier frequency of the carrier signal $S_T$. A transfer circuit 35 is associated with the resonant circuit 34, which generates a signal proportional to a voltage across the rejector circuit, and whose output can be coupled to the phase comparator 18 (FIG. 1), or to the rectifier 19 (FIG. 2), so that the carrier frequency $f_T$ is tuned to the resonant frequency of the resonant circuit 34.

The coils 30, and 33, and the capacitor 32 form a low-pass filter. The coil 33 provides an additional damping for the components of any interfering spectrum occurring above the resonant frequency of the resonant circuit 34.

We wish it to be understood that we do not desire to be limited to the exact details of construction shown and described, for obvious modifications will occur to a person skilled in the art.

Having thus described the invention, what we desire to be secured by Letters Patent, is as follows:

1. A pulse width, modulated signal amplifier comprising in combination:
   a pulse-width modulator, having an input for receiving a low frequency modulation signal, an input for receiving a carrier frequency signal, said modulator generating pulses at said carrier frequency, each pulse having a width modulated by said low frequency modulation signal,
   a carrier frequency signal generator having a control input for said carrier frequency and an output connected to the carrier frequency signal input of said pulse-width modulator,
   a buffer stage postcoupled to said pulse-width modulator,
   an output filter postcoupled to said buffer stage, including relatively narrow-band resonant circuit means having a resonance frequency, for damping and at least partly supressing the carrier frequency, and
   regulator means forming a feedback path between said resonant circuit means, and said control input of said carrier frequency signal generator for maintaining the carrier frequency tuned substantially to the resonance frequency of said resonant circuit means.

2. A pulse-width modulator circuit as claimed in claim 1, wherein said buffer stage includes an amplifier, and said resonant circuit means includes an absorptive filter.

3. A pulse-width modulator circuit as claimed in claim 1, wherein said buffer stage includes an amplifier, and said resonant circuit means includes a rejector circuit.

4. A pulse-width modulator circuit as claimed in claim 2, wherein said absorptive filer includes transfer circuit means for generating a signal proportional to a current in said absorptive filter.

5. A pulse-width modulator circuit as claimed in claim 3, wherein said rejector circuit includes transfer circuit means for generating a signal proportional to a voltage across said rejector circuit.

6. A pulse-width modulator circuit as claimed in claims 4 or 5, wherein said carrier signal generator has a control input, and wherein said transfer circuit means has an output, and wherein said regulating means further comprise a phase comparator having first and second inputs, and an output connected to said control input of said carrier signal generator, the output of said transfer circuit means being connected to the first input of said phase comparator, and the output of said carrier signal generator being connected to the second input of said phase comparator.

7. A pulse-width modulator circuit as claimed in claims 4 or 5, wherein said carrier signal generator has a control input, and further comprising envelope detector means postcoupled to said transfer circuit means, said envelope detector means having an output connected to said control input of said carrier signal generator.

* * * * *